(12) United States Patent
Urso

(10) Patent No.: US 6,532,441 B1
(45) Date of Patent: Mar. 11, 2003

(54) PARALLEL OVERSAMPLED DECIMATOR FILTER

(75) Inventor: Pietro Urso, Grenoble (FR)

(73) Assignee: Stmicroelectronics S.A., Gentilly (FR)

( * ) Notice: Subject to any disclaimer, the term of this patent is extended or adjusted under 35 U.S.C. 154(b) by 0 days.

(21) Appl. No.: 09/334,038

(22) Filed: Jun. 15, 1999

(30) Foreign Application Priority Data

Jul. 6, 1998 (FR) .............................. 98 08612

(51) Int. Cl.[7] .............................. G06F 17/17

(52) U.S. Cl. .............................. 703/313; 341/61

(58) Field of Search .............................. 708/313, 300, 708/301, 303, 307, 316; 341/61

(56) References Cited

U.S. PATENT DOCUMENTS 4,983,975 A    1/1991   Sugino et al.
5,274,372 A  * 12/1993  Luthra et al. ............. 341/61

OTHER PUBLICATIONS

G. Bi, et al., *Rational Sampling Rate Conversion Structures With Minimum Delay Requirements*, IEE Proceedings E. Computers & Digital Techniques, vol. 139, No. 6 Part E, Nov. 1, 1992, pp. 477–485.

* cited by examiner

*Primary Examiner*—Chuong Dinh Ngo
(74) *Attorney, Agent, or Firm*—Allen, Dyer, Doppelt, Milbrath & Gilchrist, P.A.; Lisa K. Jorgenson (57) ABSTRACT

The decimator filter includes at least three identical undersampled filters out-of-phase with each other and connected in parallel, and an interpolator connected to the output of each filter. The decimator filter includes a triple integrator having an output connected to each of the filters. Each filter defines a channel that includes in sequence an undersampling circuit, a differentiator and a multiplier. The outputs of the multipliers are connected to an adder. The input signals to each of these channels are offset by a delay equal to one period of the oversampled frequency. Each undersampling circuit and each multiplier has a second input receiving a signal from a state machine. The decimator filter improves the required phase extraction time and the precision defined in the ISDN U interface specifications. By combining the decimation filter and the extraction functions, a device is produced in a small area, which consequently, consumes low power.

19 Claims, 7 Drawing Sheets

PARALLEL OVERSAMPLED DECIMATOR FILTER

FIELD OF THE INVENTION

The invention relates to the field of electronic circuits, and, more particularly, to a filter.

BACKGROUND OF THE INVENTION

The Integrated Services Digital Network (ISDN) is an all digital communication network that allows for the transmission of voice, data and video using a bandwidth 3 kHz wider than the analog telephone bandwidth. The transmission is at a rate of 144 kbps using voice/data B channels. The basic idea of this type of network is to move the analog-digital conversion point from the exchange to the subscriber. The signal transmitted on a standard copper cable is thus a digital signal. With the basic access throughput, each subscriber terminal is connected to the exchange through two B channels and one D channel (2B+1D). For this basic access, each B channel carries a 64 kbps data stream, and the D channel carries a throughput of 16 kbps.

An ISDN structure for a basic access connection includes a line termination LT, a network termination NT, a U interface that forms the link between the LT and NT terminations, and at least one terminal equipment TE. The line termination LT performs the transmitting and receiving function for the 2B+D channels exchanged between the exchange and the user equipment by adapting the data format typical of the U interface with the data format of the exchange internal bus.

Digital transmission on copper loops with two wires has improved in recent years with a U interface, particularly with an ISDN access reception at the basic throughput. The ANSI standard requires an integral duplex type data transmission at 160 kbits/s using a 2B1Q type line code with echo suppression and time extraction. The transmitting and receiving clocks are synchronous at the network termination NT end, but a robust algorithm is necessary at the line termination LT end to synchronize received data with the transmitted data. For future applications, it is desirable that the phase difference between the transmit clock BCLK and the receive clock RXBCLK be stored so that the transit time can be precisely measured.

Figure 1:
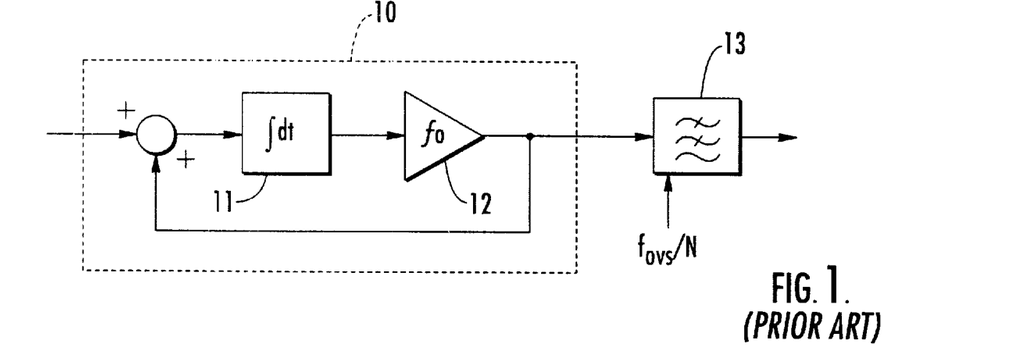
FIG. 1 illustrates a sigma-delta digital/analog converter according to the prior art.

When implementing a phase lock loop PLL for phase extraction, the error in estimating the sampling phase is entered into a clock generation block to adjust the phase of the clock used for reduction of the received signal. In a prior art device, as shown in FIG. 1, a sigma-delta type digital/analog converter 10 includes an integrator 11 and an analog/digital converter 12 (threshold quantification, 1 bit) to output a sample at an oversampling frequency that is fixed with the signal output by a clock generation circuit. This converter 10 is followed by a low pass decimation filter 13.

The transfer function of this filter is as follows:

$$\left(\frac{1}{1-z^{-1}}\right)^3 (1-z^{-ovs})^3$$

Figure 2A:
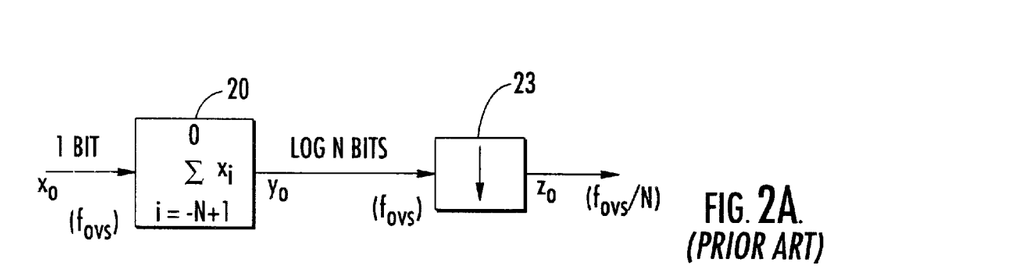
FIGS. 2A–2C illustrate a decimator filter according to the prior art.
Figure 2B:
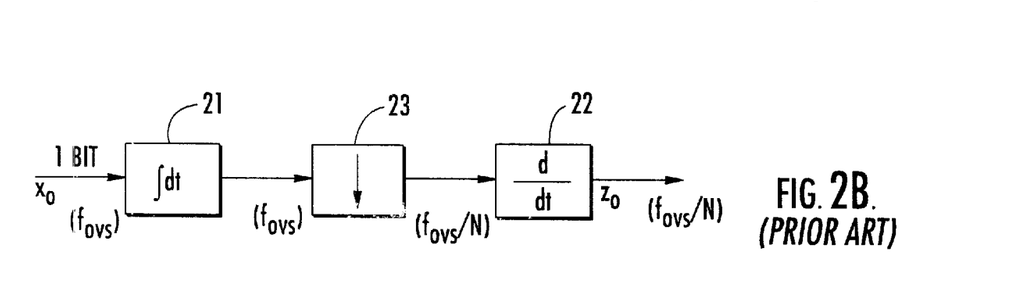
Figure 2C:
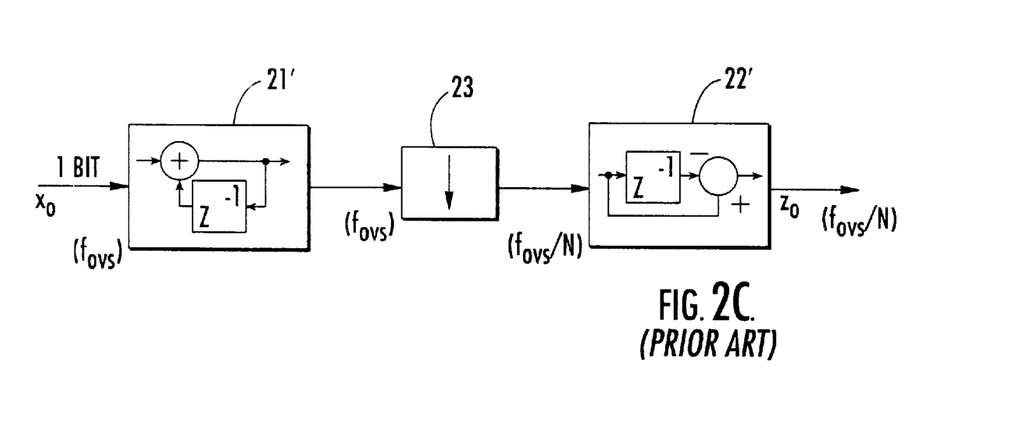

The variable ovs is the oversampling factor, and for example, ovs may equal 192. The decimation filter 13, the structure of which is shown in FIGS. 2A, 2B and 2C, performs a moving average of 192 input samples to one bit. The decimation filter 13 also supplies the band limitation function necessary to limit parasitic end coupling and quantification noise. This type of structure is reliable and has low power consumption.

FIGS. 2A, 2B and 2C are three equivalent representations. The low pass filter 20 in FIG. 2A is respectively replaced in FIGS. 2B and 2C by an integrator 21, 21' and a differentiator 22, 22' located on each side of an undersampling module 23. Thus, the integrators 21, 21' used at the oversampling throughput are followed by a decimation module 23, 23' and then a differentiation module 22, 22'.

Figure 3:
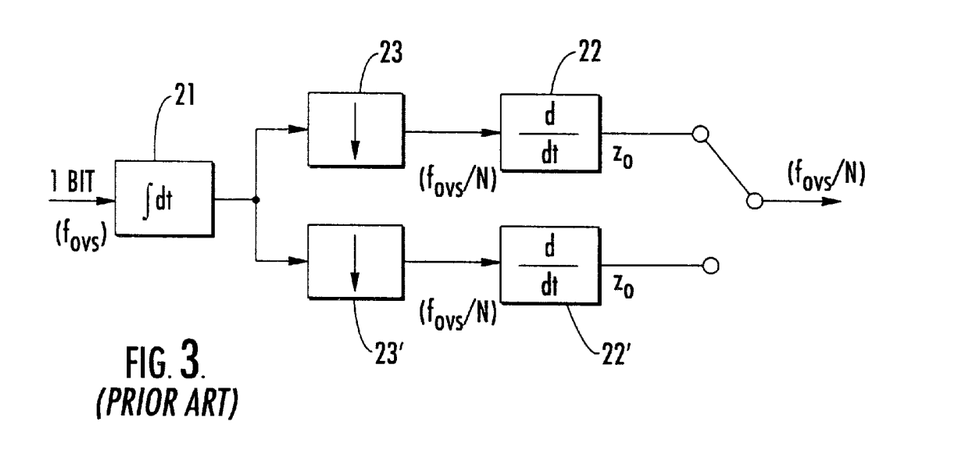
FIG. 3 illustrates another decimator filter according to the prior art.

During the undersampling process, the clock sampling phase is adjusted by the time extraction algorithm. This type of characteristic requires a parallel structure to avoid extraneous output overshoots which require a long set up time for high order filters. The straightforward approach shown in FIG. 3 includes two parallel channels at the output of the integrator 21. Each channel includes an undersampling module 23, 23' followed by a differentiator 22, 22' to output a reliable output sample. The sample is switched onto a channel that does not vary in time when the direct channel has to make a phase skip. The channel thus avoided can only be reused after the set-up time, which depends on the filter order. When a third order filter is used, the set up time is equal to three clock periods.

An article titled "A Digital Signal Processor For An ANSI Standard ISDN Transceiver" by Agazzi et al., and published in the IEEE Journal of Solid-State Circuits, Volume 24, No. 6, December 1989, pages 1605–1611, describes a digital signal processing module for an ISDN transmitter according to the American National Standards Institute (ANSI) standard. This module is similar to a multiprocessor architecture in which each processor is optimized. Another article titled "Two-Phase Decimation And Jitter Compensation In Full-Duplex Data Transceivers," by Agazzi et al., and published in IEEE, 1992, pages 1717–1720, describes a two-phase decimation technique. When this technique is combined with a known jitter compensation technique, it can maintain the performance of the echo emulator in a full duplex data transmitter in the presence of phase skips generated by the phase locking and clock extraction loop, and fast changes in the input signal sampling phase.

SUMMARY OF THE INVENTION

An object of the present invention is to provide a decimator filter that provides a phase extraction algorithm while avoiding instability of the delta-sigma converter due to adjustment of the sampling phase. More particularly, the decimator filter has application for digital phase extraction with a granularity or minimum precision of 1 ns in modems with an Integrated Services Digital Network (ISDN) U interface.

The decimator filter includes at least three identical undersampled filters out-of-phase with each other and connected in parallel, and an interpolator connected to the output of each filter. In one embodiment, the decimator filter includes a triple integrator having an output connected to each of the filters. Each filter defines a channel that includes in sequence an undersampling circuit, a differentiator and a multiplier. The outputs of the multipliers are connected to an adder. The input signals to each of these channels are offset by a delay equal to one period of the oversampled frequency. Each undersampling circuit and each multiplier has a second input receiving a signal from a state machine.

In another embodiment, the decimator filter includes a triple integrator followed by a first phase shift register with at least three positions equal to the number of channels connected to the first inputs of a demultiplexer. The outputs of the first phase shift register are connected to the first inputs of a subtracter through a second phase shift register, and to the second inputs of the subtracter. The outputs from the subtracter are connected to the second inputs of the demultiplexer, and to a third phase shift register with at least three positions related to a dichotomizing adder.

The interpolator is used to choose the sampling instant with a resolution equal to 1/64 of the period of the output sampling clock. The decimator filter according to the present invention improves the required phase extraction time and the precision defined in the ISDN U interface specifications. By combining the decimation filter and the extraction functions, a device is produced in a small area, which consequently, consumes low power.

DETAILED DESCRIPTION OF THE PREFERRED EMBODIMENTS

Figure 4:
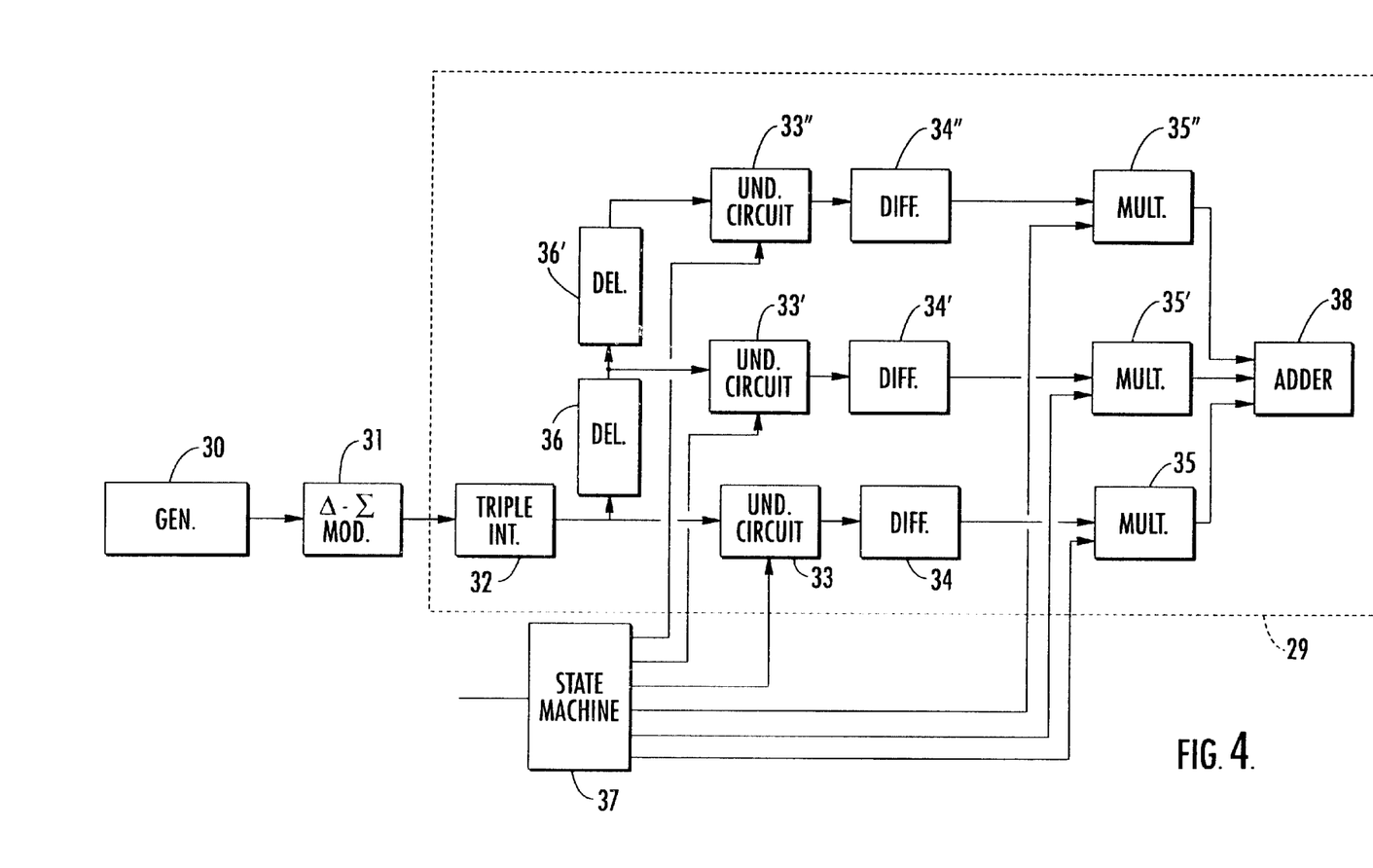
FIG. 4 illustrates a decimator filter according to the present invention.

FIG. 4 illustrates a generator 30 providing an output signal to a delta-sigma modulator 31. A decimator filter 29 according to the present invention is connected to the output of the delta-sigma modulator 31. The decimator filter 29 includes a triple integrator 32. The output of the triple integrator 32 is connected to three parallel channels. Each channel includes in sequence a respective undersampling block 33, 33', 33", a differentiator 34, 34', 34" and a multiplier 35, 35', 35".

The, input signals to each of these channels are offset by a delay equal to one period of the oversampled frequency. In other words, a delay of 64 ns is caused by the respective delays 36, 36'. Each undersampling circuit 33, 33', 33" and each multiplier 35, 35', 35" is provided with a second input for receiving a signal from a state machine 37. The outputs from the three multipliers 35, 35', 35" are connected to an adder 38.

A linear interpolator is formed using the three multipliers 35, 35', 35" and the adder 38. It is thus possible to make a third order filter, the setup time of which is equal to three clock periods. The introduction of a third channel in parallel, according to the present invention, reduces the extraction time and provides a precision of one nanosecond, i.e., 1/64th of the output throughput.

Figure 5:
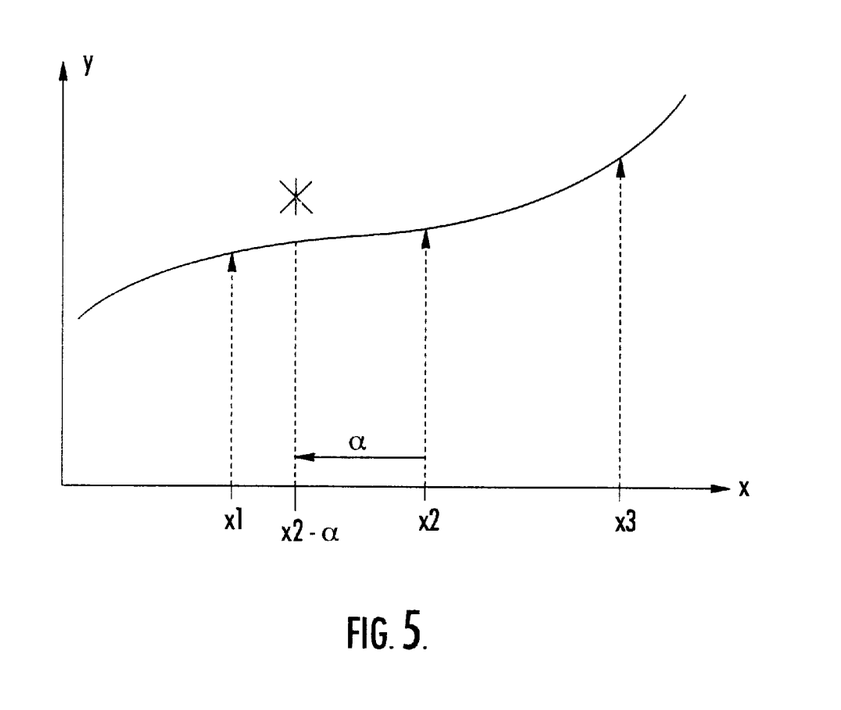
FIG. 5 illustrates a plot of an interpolation function versus time.
Figure 6A:
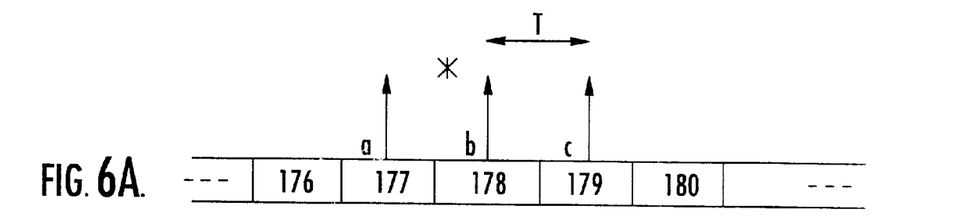
FIGS. 6A–6D respectively illustrate an example interpolation case.
Figure 6B:
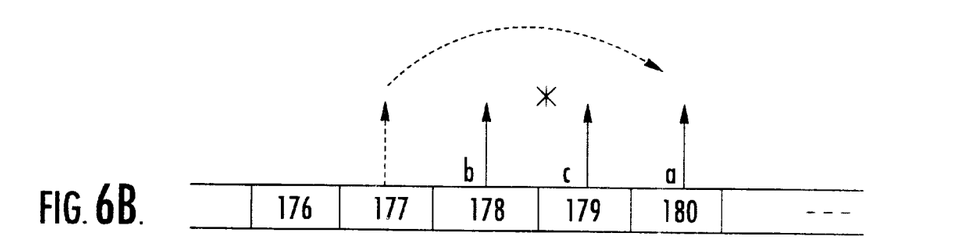
Figure 6C:
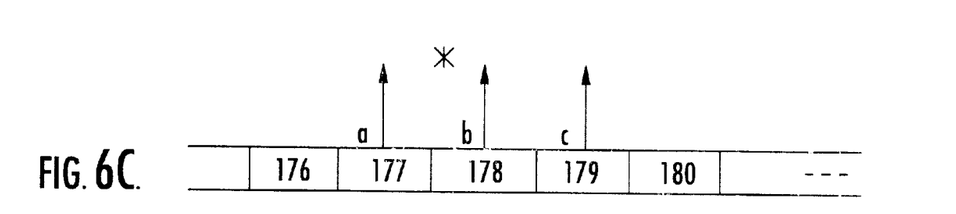
Figure 6D:
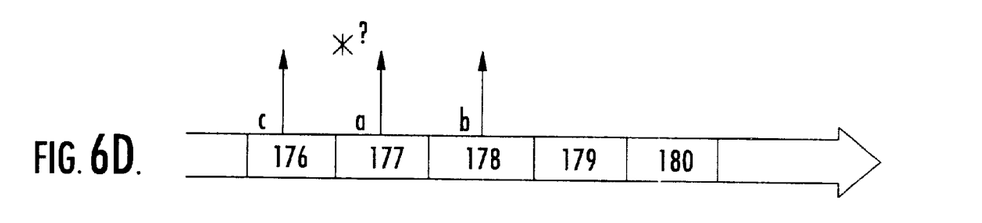

The three channels are multiplexed in the finite state machine 37 according to the phase adjustment command. The output is the interpolated value between the two samples that are reliable. The three undersampling blocks 33, 33', 33" follow the phase adjusted undersampled samples. The interpolation function $y=f(x_1, x_2, x_3, \alpha)$ as a function of time is illustrated in FIG. 5, and is chosen as a function of the position of the channels.

When a channel makes a phase skip, the other two channels provide the output sample interpolated at the clock rate if the two channels are reliable. In FIGS. 6A to 6D, the oversampling ratio is 192, and the time scale is shown modulo 192 in order to illustrate the phase skips of this channel. The asterisk * illustrates the output value, and T is the period of the sampling clock.

Four possible states are shown in FIGS. 6A to 6D. The states are as follows: A) Default: channels a and b are used to interpolate the output value using a linear function. B) Skip forwards: channel a is delayed by three oversampled periods and will not be reliable for the same time period due to the third order filter. C) Skip backwards: the phase of channel a (the last phase) reduces its phase by three and the output value is extrapolated from channels b and c. D) Successive skips: a second skip backwards produces an unreliable extrapolation since the setup time for channel a is not yet complete.

All adjustment commands are ignored unless there are at least two available and reliable channels. The circuit according to the present invention may be modified to have more than three channels if it is required to avoid this characteristic, and skips more quickly without waiting for a stable value. In this case, the avoided channel cannot be reused until after its setup time has elapsed.

Figure 7:
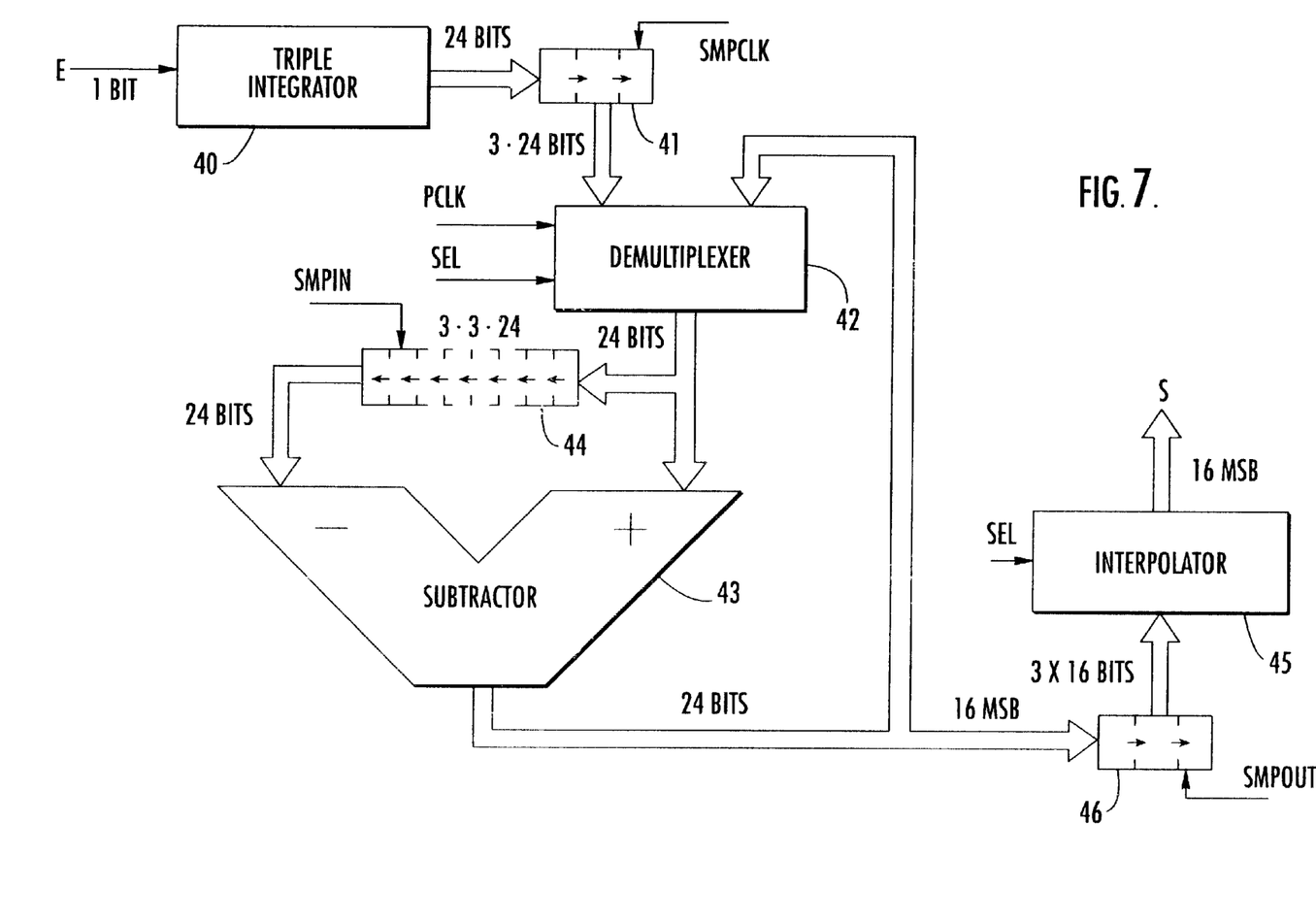
FIG. 7 illustrates another decimator filter according to the present invention.

The circuit illustrated in FIG. 4 can be modified to reduce its surface area as shown in FIG. 7. This circuit includes a triple integrator 40 corresponding to three integrators in series, followed by a phase shift register 41 with at least three positions as described above. The number of channels is at least equal to 3. The phase shift register 41 is connected to the first inputs of a demultiplexer 42. The outputs of the demultiplexer 42 are, firstly, connected to the negative inputs of a subtracter 43 through a second shift register 44 and, secondly, to the positive inputs of the subtracter 43. The subtracter 43 is a 24-bit subtracter, for example.

Figure 8:
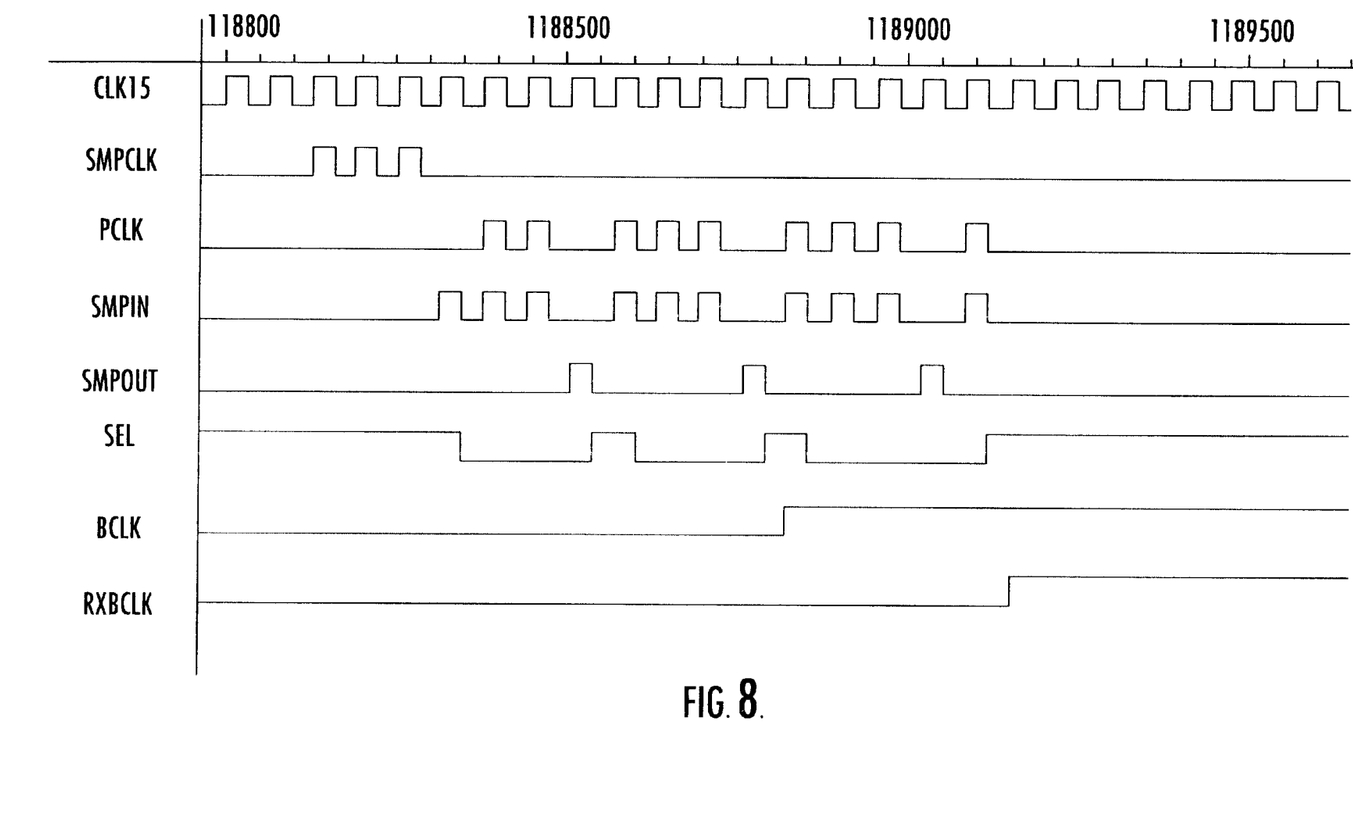
FIG. 8 illustrates an example timing diagram of the signals shown in FIG. 7.

The outputs from the subtracter 43 are, firstly, connected to second inputs of the demultiplexer.42 and, secondly, to a third shift register 46 with at least three positions connected to a dichotomizing interpolator 45. The various signals illustrated in FIG. 7 are indicated in FIG. 8 for an example operation. The triple integrator 40 operates at an oversampling throughput, i.e., 15.36 MHz.

Figure 9:
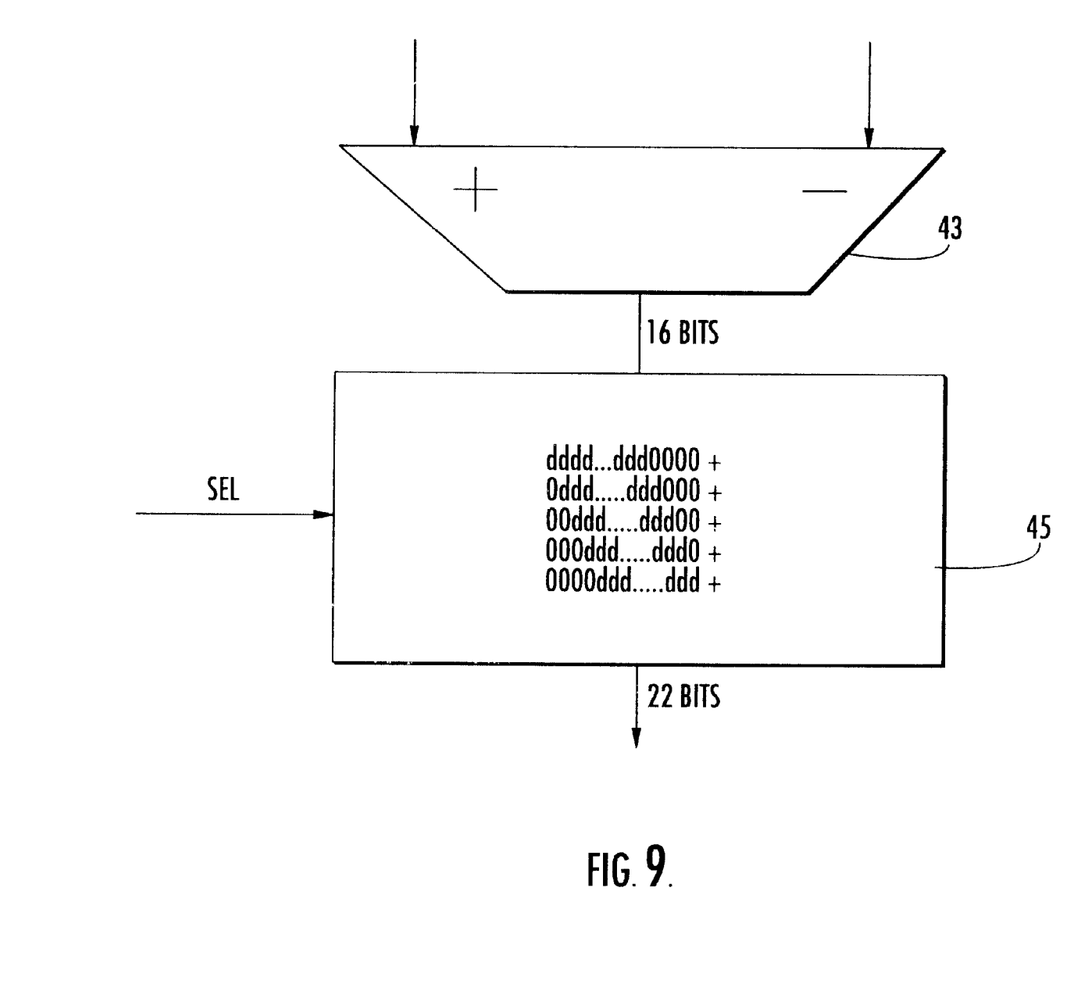
FIG. 9 illustrates operation of the dichotomizing interpolator illustrated in FIG. 7.

The subtracter 43 is used to carry out differentiation operations. The second phase shift register 44 forms the memory cell. Its length is equal to the number of channels times the order of the filter, e.g., 3×3. The output sample is provided by an interpolator including the dichotomizing interpolator 45. This interpolator is such that the difference between two samples is divided by 2, 4, 8, . . . 64, with a 6-bit offset. The results are added together according to the relative position of the interpolated value, as shown in FIG. 9.

In each BCLK period, the demultiplexer 42 stores and selects three samples from the triple integrator 40. The phase shift register 46 stores the three results of the subtraction operation for each channel. The output from the demultiplexer 42 is an incrementation value, or the new input sample depending on the expected state. When an output value is calculated for a channel, i.e., after three loops in the adder, it is stored in the interpolator 45, and a new input value is input into the processing loop. This embodiment only uses the 16 most significant bits among the 24 to calculate the output value.

In this type of embodiment, the phase extraction algorithm is more precise in estimating the phase delay, and output values have less distortions. If the sampling frequency is sufficiently high for a linear approximation of the input signal, the distortion gain of the interpolation is $G=20 \log(64) = 36$ dB.

That which is claimed is:

1. A decimator filter comprising:
   at least three substantially identical undersampled filters connected in parallel and out-of-phase with each other; and
   an interpolator connected to the outputs of said undersampled filters.

2. A decimator filter according to claim 1, wherein each undersampled filter comprises an undersampling circuit and a differentiator connected thereto.

3. A decimator filter according to claim 2, wherein said interpolator comprises at least three multipliers connected to respective outputs of said differentiators, and an adder connected to outputs of said multipliers.

4. A decimator filter according to claim 3, further comprising:
   a triple integrator;
   a delay circuit connected between an output of said triple integrator and inputs of said undersampled filters so an input signal to each undersampled filter is delayed one period of an oversampled frequency; and
   a state machine connected to said undersampling circuit and to said multipliers.

5. A decimator filter comprising:
   a triple integrator;
   at least three undersampled filters connected in parallel and out-of-phase with each other, each undersampled filter having an input connected to said triple integrator and comprising an undersampling circuit and a differentiator connected thereto; and
   an interpolator connected to outputs of said undersampled filters.

6. A decimator filter according to claim 5, wherein said at least three undersampled filters are substantially identical to each other.

7. A decimator filter according to claim 5, wherein said interpolator comprises at least three multipliers connected to respective outputs of said differentiators, and an adder connected to outputs of said multipliers.

8. A decimator filter according to claim 5, further comprising:
   a delay circuit connected between an output of said triple integrator and inputs of said undersampled filters so an input signal to each undersampled filter is delayed one period of an oversampled frequency; and
   a state machine connected to said undersampling circuits and to said multipliers.

9. An Integrated Services Digital Network (ISDN) comprising a line termination circuit performing transmitting and receiving functions for channels exchanged over an ISDN interface, said line termination circuit comprising:
   a circuit for extracting a phase delay from an input signal comprising
      a delta-sigma modulator,
      a triple integrator connected to an output of said delta-sigma modulator,
      at least three substantially identical undersampled filters connected to an output of said triple integrator, and said at least three undersampled filters being connected in parallel and out-of-phase with each other, and
      an interpolator connected to outputs of said undersampled filters.

10. An ISDN according to claim 9, wherein each undersampled filter comprises an undersampling circuit and a differentiator connected thereto.

11. An ISDN according to claim 10, wherein said interpolator comprises at least three multipliers connected to respective outputs of said differentiators, and an adder connected to outputs of said multipliers.

12. An ISDN according to claim 11, further comprising:
   a delay circuit connected between the output of said triple integrator and inputs of said undersampled filters so an input signal to each undersampled filter is delayed one period of an oversampled frequency; and
   a state machine connected to said undersampling circuit and to said multipliers.

13. A method of extracting a phase delay using a decimator filter, the method comprising the steps of:
   filtering an input signal using at least three substantially identical undersampled filters connected in parallel and out-of-phase with each other; and
   interpolating an output signal of each undersampled filter.

14. A method according to claim 13, wherein the step of filtering comprises:
   undersampling the input signal by each undersampled filter; and
   differentiating an undersampled signal for each undersampled filter.

15. A method according to claim 14, wherein the step of interpolating comprises multiplying a differentiated signal for each undersampled filter.

16. A method according to claim 15, further comprising the step of adding the multiplied differentiated signals.

17. A method according to claim 13, further comprising the step of triple integrating a signal received from a delta-sigma modulator to provide the input signal.

18. A method according to claim 17, further comprising the step of delaying the input signal to each undersampled filter by one period of an oversampled frequency.

19. A method according to claim 17, further comprising the step of providing inputs to each undersampling circuit and to each multiplier from a state machine.

* * * * *